United States Patent
Chan et al.

(10) Patent No.: US 11,869,762 B2
(45) Date of Patent: Jan. 9, 2024

(54) SEMICONDUCTOR DEVICE WITH TEMPERATURE SENSING COMPONENT

(71) Applicant: Alpha Power Solutions Limited, Hong Kong (CN)

(72) Inventors: Wai Tien Chan, Hong Kong (CN); Qian Sun, Hong Kong (CN); Ho Nam Lee, Hong Kong (CN)

(73) Assignee: Alpha Power Solutions Limited, Hong Kong (CN)

( * ) Notice: Subject to any disclaimer, the term of this patent is extended or adjusted under 35 U.S.C. 154(b) by 477 days.

(21) Appl. No.: 16/949,068

(22) Filed: Oct. 13, 2020

(65) Prior Publication Data

US 2022/0115289 A1 Apr. 14, 2022

(51) Int. Cl.

| H01L 23/34 | (2006.01) |
|---|---|
| H01L 27/06 | (2006.01) |
| H01L 21/28 | (2006.01) |
| H01L 29/49 | (2006.01) |
| G01K 7/22 | (2006.01) |
| G01K 7/16 | (2006.01) |
| G01K 7/01 | (2006.01) |
| H01L 49/02 | (2006.01) |

(52) U.S. Cl.
CPC ............... H01L 28/20 (2013.01); G01K 7/16 (2013.01); G01K 7/22 (2013.01); G01K 7/223 (2013.01); G01K 7/226 (2013.01); H01L 21/28035 (2013.01); H01L 23/34 (2013.01); H01L 27/0629 (2013.01); H01L 29/4916 (2013.01); *G01K 7/01* (2013.01)

(58) Field of Classification Search
CPC ............... H01L 23/34; H01L 21/28035; H01L 29/4916; H01L 27/0629; H01L 28/20; G01K 7/22; G01K 7/223; G01K 7/226
See application file for complete search history.

(56) References Cited

U.S. PATENT DOCUMENTS

| 7,145,201 | B2 | 12/2006 | Pfirsch | |
|---|---|---|---|---|
| 7,306,967 | B1* | 12/2007 | Kozhukh | H01C 7/042 |
| | | | | 438/54 |
| 2007/0178636 | A1* | 8/2007 | Nishibe | H01L 27/0629 |
| | | | | 257/E27.035 |
| 2010/0197106 | A1* | 8/2010 | Ryou | H01L 28/20 |
| | | | | 257/E21.546 |
| 2014/0264343 | A1 | 9/2014 | Harrington, III | |
| 2014/0353665 | A1* | 12/2014 | Fujii | H01L 22/12 |
| | | | | 438/659 |
| 2015/0035568 | A1* | 2/2015 | Peng | H01L 27/088 |
| | | | | 327/109 |
| 2015/0098489 | A1* | 4/2015 | Lee | B82Y 40/00 |
| | | | | 374/178 |
| 2018/0277641 | A1* | 9/2018 | Karmous | H01L 29/0615 |
| 2018/0301553 | A1* | 10/2018 | Weyers | H01L 27/0255 |
| 2020/0006495 | A1 | 1/2020 | Siemieniec et al. | |

FOREIGN PATENT DOCUMENTS

CN 102881679 B 4/2015

\* cited by examiner

*Primary Examiner* — Aaron J Gray
(74) *Attorney, Agent, or Firm* — S&F/WEHRW

(57) ABSTRACT

A semiconductor device includes a device cell including a gate component configured to receive a gate control signal and a temperature sensing component adjacent to the device cell. Each of the temperature sensing component and the gate component includes polycrystalline silicon.

8 Claims, 7 Drawing Sheets

SEMICONDUCTOR DEVICE WITH TEMPERATURE SENSING COMPONENT

FIELD

The present invention relates to semiconductor technology.

BACKGROUND

Many semiconductor devices need operate in extremely high and low temperature applications, such as electric vehicles. However, semiconductors are generally sensitive to temperature. When a semiconductor apparatus or device, such as a transistor, works in different temperature environment, the device performance changes, or even the device may be easily damaged at some extreme conditions.

New devices and processes that assist in detecting the device temperature and adjusting the device (such as a transistor) accordingly are desirable for these applications in semiconductor field.

SUMMARY

One example embodiment provides a semiconductor device. The semiconductor device includes a device cell including a gate component configured to receive a gate control signal and a temperature sensing component adjacent to the device cell. Each of the temperature sensing component and the gate component includes polycrystalline silicon.

Other example embodiments are discussed herein.

DETAILED DESCRIPTION

Figure 1A:
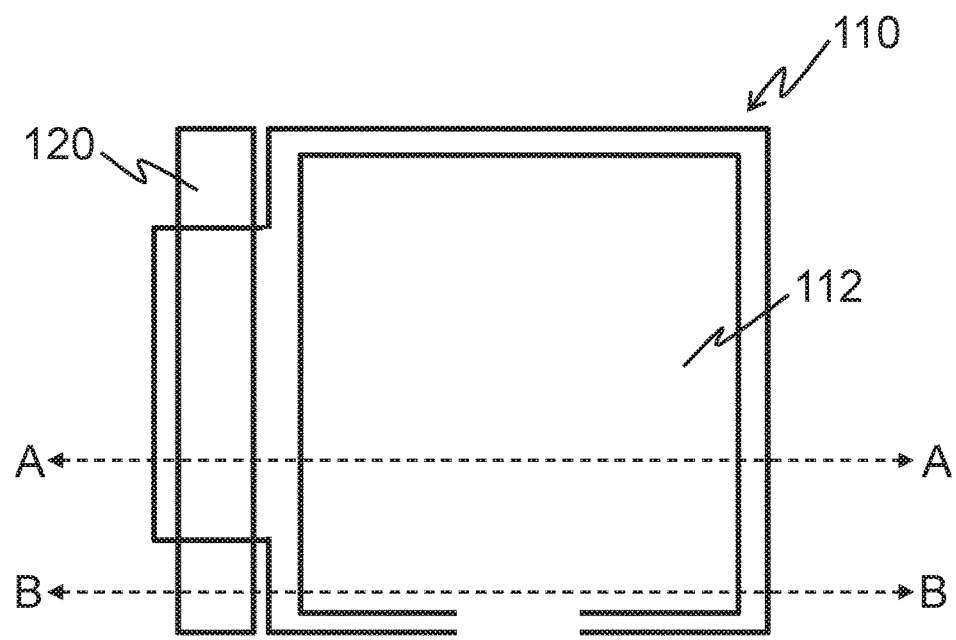
FIG. 1A illustrates a top view of a semiconductor device in accordance with an embodiment.

Example embodiments relate to semiconductor device with temperature sensing component with novel structural design and improved performance, such as fast response, improved accuracy, device protection and security, etc.

One or more embodiments recognize one or more technical problems existing for conventional devices and methods. For example, many semiconductor devices are provided with no mechanism to detect device temperature. When operating in a harsh environment or working for long hours, the device temperature may become too high, which likely results in device failure and in the meanwhile raises safety concerns. In some existing semiconductor devices, such as metal-oxide-semiconductor field-effect transistor (MOSFET), a thermistor may be disposed near a MOSFET chip inside a packaged module. This, however, results in slow response as signals carrying temperature information need transmit a long path before being sensed and processed. Another issue is the disparity between the detected temperature by the thermistor and the actual temperature of devices because of their significant physical distance.

One or more embodiments solve one or more of the technical problems associated with conventional devices as set forth above. One or more embodiments provide semiconductor devices with improvement in one or more aspects, such as improved accuracy, fast response, improved protection, and simple and cost-effective manufacturing process.

Example embodiments include a semiconductor device embedding a temperature sensing component or mechanism. The temperature sensing component is arranged within or as part of the semiconductor device. The temperature sensing component is disposed adjacent to a device cell. Due to their physical proximity, the difference between the temperature sensed or detected by the temperature sensing component and the actual temperature of the device can be reduced. Furthermore, fast response can be achieved as temperature variation can be quickly caught. According to one or more embodiments, both the temperature sensing component and the gate component of the semiconductor device are formed from a same polycrystalline silicon layer. The temperature sensing component is doped and has a negative temperature coefficient. The geometrical parameters (such as thickness, ratio of length to width, etc.) and doping profiles can be easily tuned to achieve desirable temperature coefficients and/or temperature ranges to be detected. According to one or more embodiments, a temperature range from −55 degree centigrade (° C.) to 250° C. can be achieved.

Example embodiments include a method for manufacturing a semiconductor device with a temperature sensing component. The temperature sensing component and the gate component of the semiconductor device are formed from a same layer, such as a polycrystalline silicon layer. This is simple and cost-effective. For example, the method does not unduly increase process complexity. After forming the polycrystalline silicon layer, for example, the temperature sensing component can be formed simply by one or more separate ion implantation steps and patterning and etching for the doped polycrystalline silicon layer. Temperature sensing-related characteristics can be easily tuned by tuning the manufacturing process, such as doping parameters (implantation energy, dose, impurity type, etc.).

Example embodiments include a temperature sensing system. The temperature sensing system enables fast and actuate detection of temperature for a semiconductor device. The system can responsively adjust the control of the device so that the device temperature is prevented from going too high. Accordingly, the device is less likely to fail, which improves operation security and also benefits device's service life.

In accordance with one aspect of embodiments, FIG. 1A illustrates a top view of a semiconductor device in accordance with an embodiment. The semiconductor device may be a MOSFET, an insulated-gate bipolar transistor (IGBT), a junction gate field-effect transistor (JFET), or other suitable semiconductor devices. The semiconductor device may be silicon (Si)-based, silicon carbide (SiC)-based, etc. For concise and clarify, FIG. 1A is illustrative and non-limiting, and illustrates some elements or components rather than all elements of the semiconductor device. This approach is similarly adopted to one or more of other figures as referenced herein.

As illustrated, the semiconductor device includes a device cell 110 and a temperature sensing component 120. The device cell 110 includes a gate component 112 configured to receive a gate control signal. The gate control signal, for example, is a voltage signal that controls operation states (such as ON or OFF state) of the semiconductor device.

The temperature sensing component 120 is disposed adjacent or close to the device cell 110. In some embodiments, the temperature sensing component 120 may be arranged within the device cell 110. The temperature sensing component 120 detects or senses temperature of the device cell 110. Each of the temperature sensing component 120 and the gate component 112 includes polycrystalline silicon.

Figure 1B:
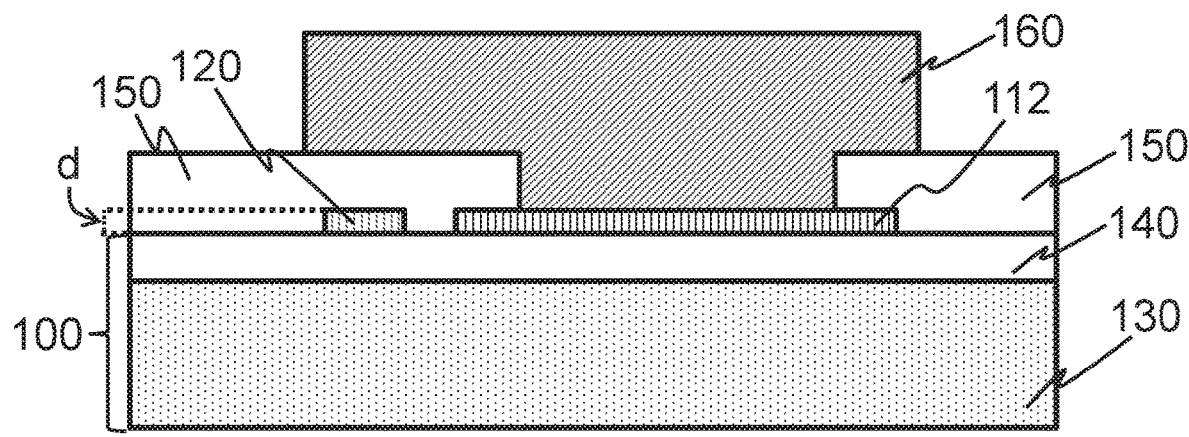
FIG. 1B illustrates a cross-section view along line A-A of FIG. 1A.
Figure 1C:
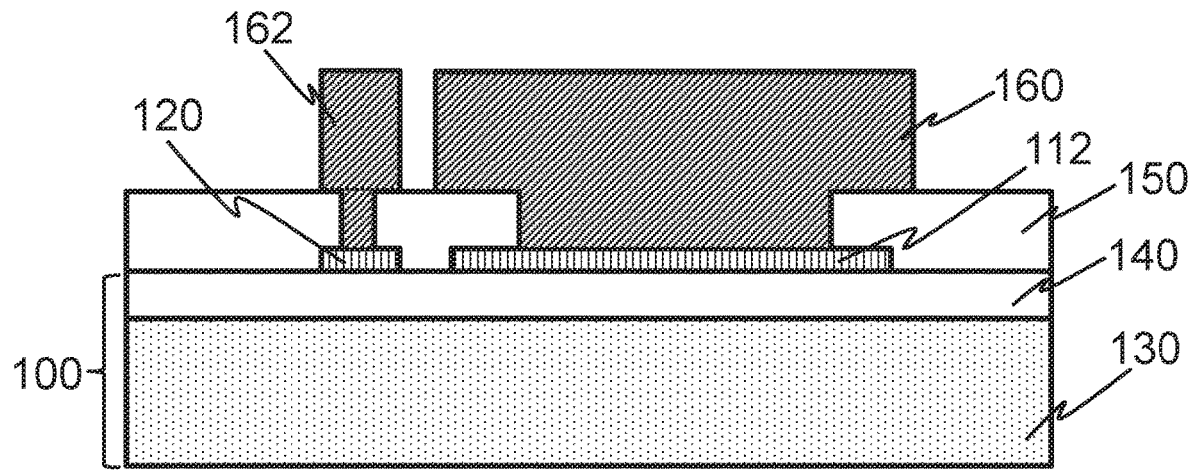
FIG. 1C illustrates a cross-section view along line B-B of FIG. 1A.

FIG. 1B and FIG. 1C illustrate cross-section views along lines A-A and B-B of FIG. 1A respectively. To facilitate ease of understanding, layers such as an interlayer dielectric (ILD) layer 150 and metal or contact layers 160 and 162 are added in these two figures. Those skilled in the art would appreciate that these are not essential to the embodiments as described.

As illustrated, a semiconductor base 100 includes a semiconductor substrate 130 and a common layer 140. The semiconductor substrate 130 may include Si, SiC, or one or more of other suitable semiconductor materials according to practical needs. The semiconductor substrate 130 may include one or more layers, areas, or regions. The semiconductor substrate 130 may have been treated, such as having been subject to multiple process steps, such as ion implantation, etching, temperature treatment, etc. such that desirable structural profiles have been formed. The common layer 140 is disposed on the semiconductor substrate 130 and may be a dielectric layer. The common layer 140 may include silicon oxide or be an oxide layer.

The temperature sensing component 120 and the gate component 112 are disposed on the common layer 140 and are spaced from each other. The gate component 112 contacts the metal layer 160, and the temperature sensing component 120 contacts the metal layer 162. The gate component 112 and the temperature sensing component 120 are isolated and also at least partially covered by the ILD layer 150.

By way of example, the temperature sensing component 120 has a negative temperature coefficient (NTC). For example, the temperature sensing component 120 is formed as a NTC resistor, such as a polycrystalline silicon resistor. The thickness (indicated as "d" in FIG. 1B) of the resistor is in a range from 200 nm to 1 micrometer (um), such as 500 nm.

By way of example, the polycrystalline silicon of the temperature sensing component 120 is doped with impurities, such as N-type impurities selected from a group consisting of phosphorus, arsenic, and nitrogen.

By way of example, the polycrystalline silicon of the temperature sensing component 120 is doped with N-type impurities having a first impurity concentration. The polycrystalline silicon of the gate component 112 is doped with N-type impurities having a second impurity concentration. The first impurity concentration is smaller than the second impurity concentration.

The doping profile for the temperature sensing component 120 or the gate component 112 may be designed according to practical needs. For example, the impurity concentration may not be uniform for each component. For example, the portions of the temperature sensing component 120 contacting metal layer 162 may be doped more heavily compared with other portions of the temperature sensing component 120.

As illustrated in FIGS. 1A-1C, as the temperature sensing component is embedded into the semiconductor device, it is unnecessary to dispose external temperature sensors. As a result, a chip module packaging such semiconductor devices can be less bulky and more compact. This is favorable to the semiconductor industry. Further, as the temperature sensing component is adjacent to the device cell, they experience almost a same environment. The temperature sensing component is able to respond timely and accurately to temperature variations. The sensed temperature can reflect more accurately what the device cell actually experiences. As such, the temperature sensing component achieves fast and accurate temperature sensing. This is particularly useful in applications that demand accurate control and high safety requirements.

Figure 2:
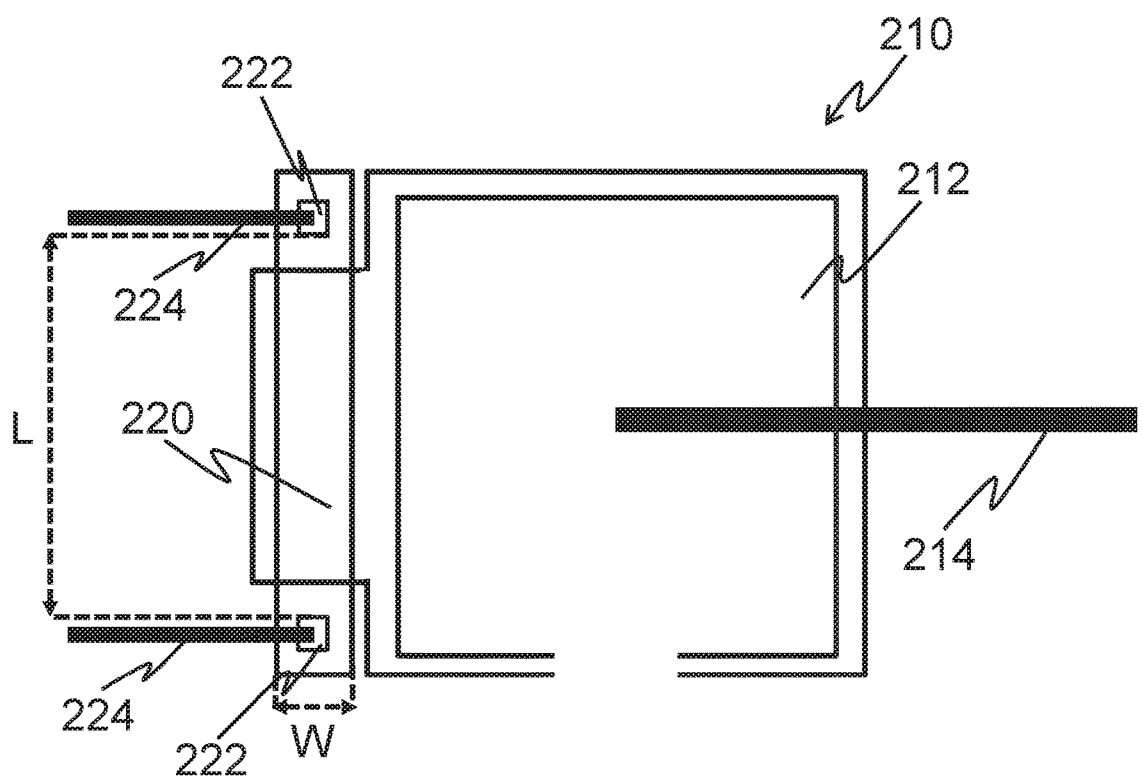
FIG. 2 illustrates a top view of a semiconductor device in accordance with an embodiment.

FIG. 2 illustrates a top view of a semiconductor device in accordance with an embodiment. As illustrated, the semiconductor device includes a device cell 210 having a gate component 212 and a temperature sensing component 220 adjacent to the device cell 210. The gate component 212 electrically connects to other circuits (such as a gate controller) via a metal wire 214. The temperature sensing component 220 connects to metal wires 224 via contacts 222.

As illustrated, the temperature sensing component 220 has a shape of a strip with a width denoted as W and a length denoted as L. The length L represents length of the temperature sensing component 220 between two contacts 222. The ratio of length to width is denoted as L/W.

Figure 3:
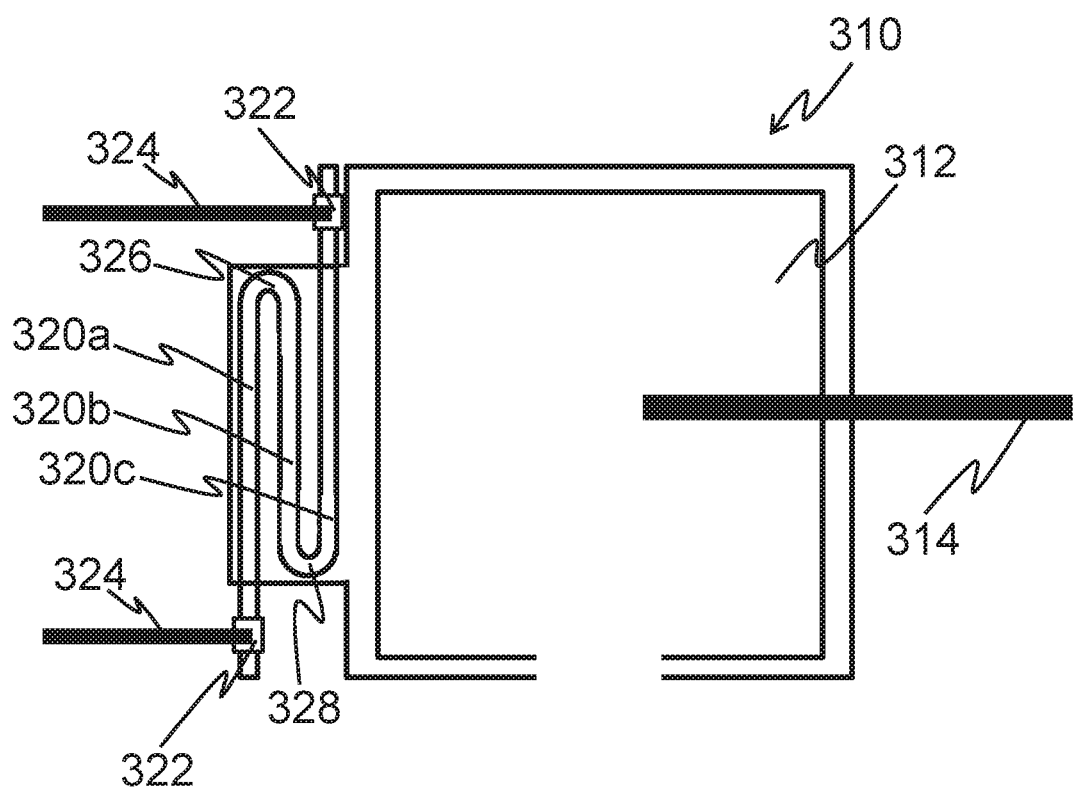
FIG. 3 illustrates a top view of a semiconductor device in accordance with an embodiment.

FIG. 3 illustrates a top view of a semiconductor device in accordance with an embodiment. FIG. 3 shows a device cell 310, a gate component 312, metal wires 314 and 324, contact 322.

As illustrated, the temperature sensing component has a shape of configuration including three strip portions 320$a$, 320$b$, and 320$c$. The strip portions 320$a$ and 320$b$ are connected through a curved portion 326. The strip portion 320$b$ passes through a curved portion 328 and then transmits to the strip portion 320$c$. The total length of the temperature sensing component is the polycrystalline silicon length between two contacts 322, which represents the addition of length of all strip portions and all curved portions. The width of one or more of the strip portions may be same or different. The length of one or more of the strip portions may be same or different.

Geometric layout of the temperature sensing components as shown in FIGS. 2 and 3 is for illustrative purpose only. Other geometric design may be adopted according to practical needs. Further, as described below, doping profile (such as impurity concentration, distribution, etc.), geometric layout, etc. may be tuned to achieve desirable sensitivity and temperature range to be detected according to practical needs. For example, the temperature sensing components may be designed to operate in a temperature range from −55° C. to 250° C. For example, temperature sensing components according to one or more embodiments as illustrated herein may detect temperatures such as −55° C., −45° C., −35° C., −25° C., −15° C., −5° C., 5° C., 15° C., 50° C., 100° C., 150° C., 200° C., 250° C., to name a few. Thus, compared with many existing temperature sensors, temperature sensing components as described herein provide improved flexibility. They can be easily tuned for various applications and have improved applicability.

Figure 4:
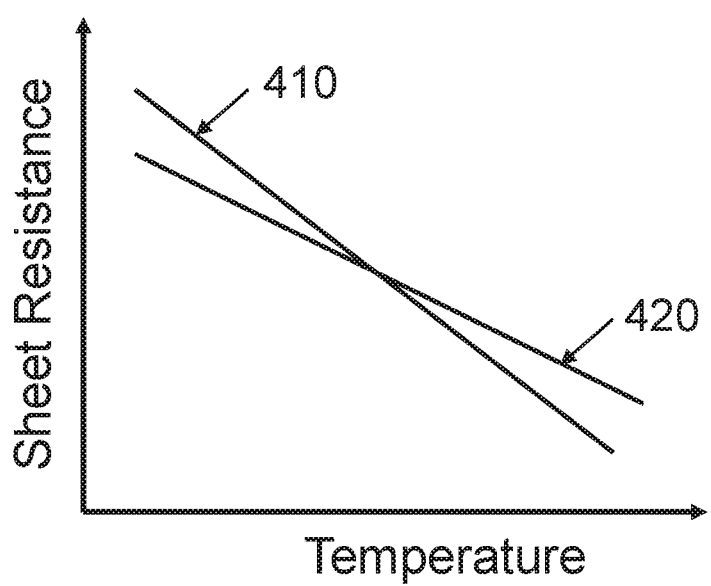
FIG. 4 illustrates temperature characteristics for temperature sensing components with different thickness in accordance with an embodiment.

FIG. 4 illustrates temperature characteristics for temperature sensing components with different thickness in accordance with an embodiment. It illustrates the relationship between sheet resistance and temperature. Sheet resistance is defined as resistivity divided by thickness, i.e. sheet resistance=resistivity/thickness. Resistivity is a fundamental property of a semiconductor material, which depends on doping level and temperature.

Each temperature sensing component is formed of a polycrystalline silicon layer. Assuming all other factors same, curve 410 corresponds to the temperature sensing component with smaller thickness (thinner polycrystalline silicon layer), while curve 420 corresponds to the temperature sensing component with larger thickness (thicker polycrystalline silicon layer). As illustrated, the thinner polycrystalline silicon layer has a larger sensitivity compared with the thicker one, but smaller temperature range to be detected.

Figure 5:
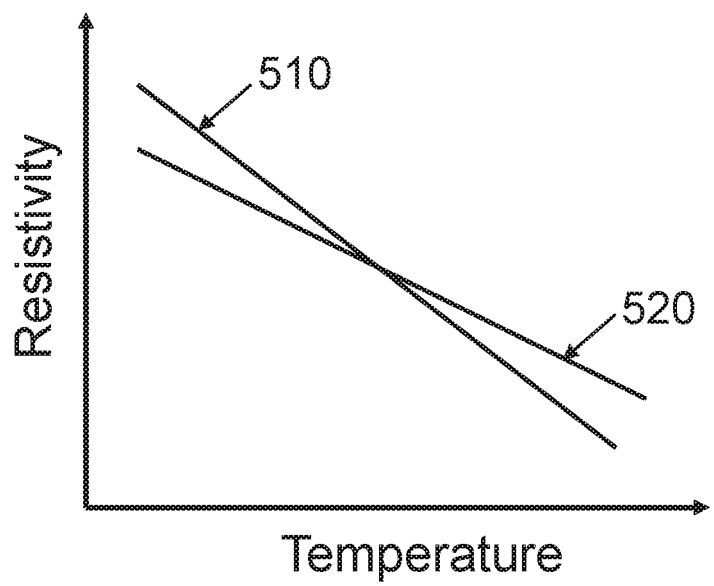
FIG. 5 illustrates temperature characteristics for temperature sensing components with different temperature coefficients in accordance with an embodiment.

FIG. 5 illustrates temperature characteristics for temperature sensing components with different temperature coefficients in accordance with an embodiment. It illustrates the relationship between resistivity and temperature.

Each temperature sensing component is formed of a polycrystalline silicon layer. Assuming all other factors same, curve 510 corresponds to the temperature sensing component with a larger temperature coefficient in its absolute value, while curve 520 corresponds to the temperature sensing component with a smaller temperature coefficient in its absolute value. As illustrated, the one with larger temperature coefficient has a larger sensitivity compared with the smaller one, but smaller temperature range to be detected.

Figure 6:
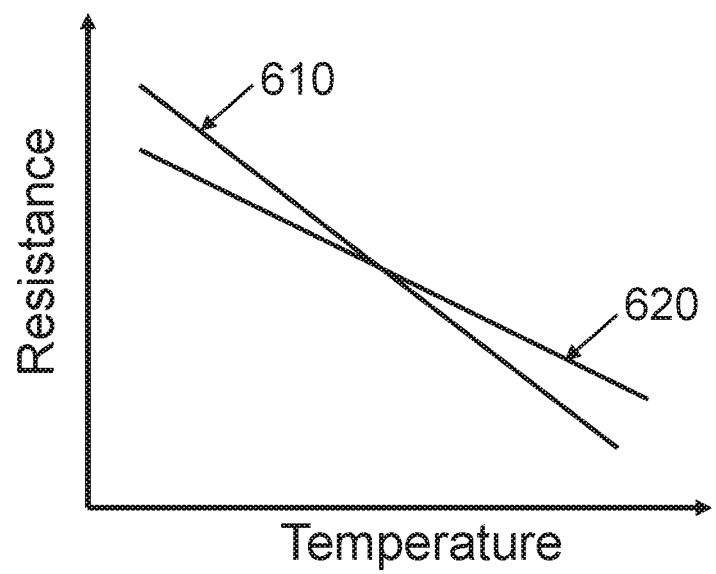
FIG. 6 illustrates temperature characteristics for temperature sensing components with different ratios of length to width in accordance with an embodiment.

FIG. 6 illustrates temperature characteristics for temperature sensing components with different ratios of length to width in accordance with an embodiment. It illustrates the relationship between resistance and temperature.

Each temperature sensing component is formed of a polycrystalline silicon layer. Assuming all other factors same, curve 610 corresponds to the temperature sensing component with a larger ratio of length to width, while curve 620 corresponds to the temperature sensing component with a smaller ratio of length to width. As illustrated, the one with larger ratio of length to width has a larger sensitivity compared with the smaller one, but smaller temperature range to be detected.

FIGS. 4-6 are for illustrative purpose only. The curves thereof are illustrated as straight lines (linear relationship). It would be appreciated that in many scenarios, the physical parameters as illustrated may have non-linear relationship.

As indicated by FIGS. 4-6, by properly tuning the process parameters (such as doping profile) and/or structural parameters (such as geometric layout), characteristics of temperature sensing components can be easily and conveniently tuned. According to scenarios to be applied and budget, temperature sensing components may be designed accordingly.

Figure 7:
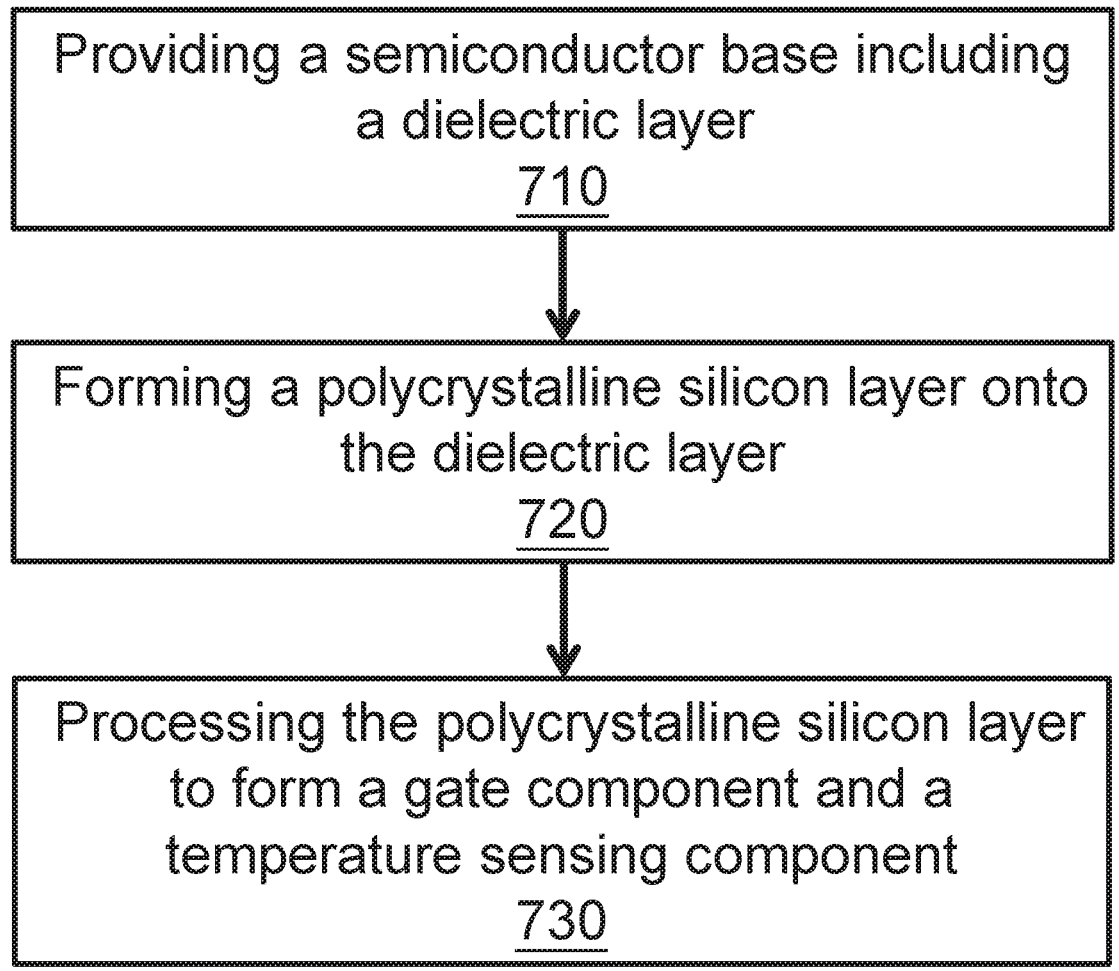
FIG. 7 illustrates a method for manufacturing a semiconductor device in accordance with an embodiment.

In accordance with another aspect of embodiments, FIG. 7 illustrates a method for manufacturing a semiconductor device in accordance with an embodiment. The method, for example, may be implemented to manufacture semiconductor devices as illustrated in one of more of FIGS. 1A-1C, 2, 3, or one or more variations thereof.

At block 710, a semiconductor base including a dielectric layer is provided. By way of example, the semiconductor base has been subject to multiple process steps. For example, the semiconductor base may has been properly processed to include one or more wells, source regions, drain regions, etc. ready for subsequent processing to form one or more field-effect transistors, such as MOSFET. By way of example, the dielectric layer is a gate oxide layer.

At block 720, a polycrystalline silicon layer is formed onto the dielectric layer. By way of example, a polycrystalline silicon layer with a thickness of 500 nm is deposited onto the gate oxide layer.

At block 730, the polycrystalline silicon layer is processed to form a gate component and a temperature sensing component spacing apart from the gate component.

By way of example, a photomask is employed to cover region of the gate component. Then ion implantation is conducted on region of the temperature sensing component by injecting N-type ions (such as phosphorus ions, arsenic ions, or nitrogen ions) at an energy of 40 keV and a dose of $1E13/cm^2$-$5E14/cm^2$. In some embodiments, as an alternative to implantation with photomask, blanket implantation is used.

Then the region of temperature sensing component is shielded or covered with another photomask. Ion implantation is conducted on region of the gate component by injecting N-type ions (such as phosphorus ions, arsenic ions, or nitrogen ions) at an energy of 40 keV and a dose of $1E15/cm^2$-$5E15/cm^2$.

It follows that poly patterning and etching are performed so that the gate component and the temperature sensing component are spaced apart from each other. A temperature treatment, such as annealing, may be conducted at a proper condition, such as annealing at 900° C. for 30 minutes in nitrogen atmosphere. Subsequent processes, such as ILD layer deposition and metallization, are conducted to conclude the manufacturing process.

In the processes as illustrated, one or more parameters may be tuned or adjusted to obtain desirable characteristics of temperature sensing components. In one embodiment, by specifying process parameters (such as ion type, implantation energy, dose, single implantation or chain implantations, temperature treatment, etc.), sensitivity of the temperature sensing component is tuned. In another embodiment, by selecting a proper thickness of polycrystalline silicon layer to be deposited, sensitivity of the temperature sensing component is tuned. In yet a further embodiment, by tuning geometric layout of the temperature sensing component, sensitivity of the temperature sensing component is tuned. The geometric layout includes, for example, geometric shape, width, length, ratio of length to width of the temperature sensing component, etc. The geometric shape may be regular, such as a strip shape as described with reference to FIG. 2. Alternatively, the geometric shape may be irregular, which may be difficult to describe but practical in use. Tuning of the geometric layout may be achieved, for example, by using a photomask with a desirable pattern that maps the pattern onto the polycrystalline silicon layer. With change in sensitivity, temperature range to be detected by the temperature sensing component may change accordingly.

In the above illustration with reference to FIG. 7, doping of the temperature sensing component is prior to doping of the gate component. This order is not essential. In some embodiments, region of the gate component is doped before region of the temperature sensing component. Further, the ion implantation process may be a single implantation or a chain of implantations with multiple implantation steps, each with same or different implantation conditions, such as energy and dose.

The manufacturing method as illustrated is simple and cost-effective. It requires no extra layer. Rather, it introduces several steps of treatment on a polycrystalline silicon layer such that the polycrystalline silicon layer is patterned into two parts, one evolving into a temperature sensing component while the other evolving into a gate component. Further, tuning characteristics of the temperature sensing component is easy, convenient, and flexible. In many scenarios, this can be achieved by changing one or more process parameters or geometric layout. Manufacturing temperature sensing component with various characteristics generally does not require an extra new equipment, and thus can be implemented in a same production line.

Figure 8:
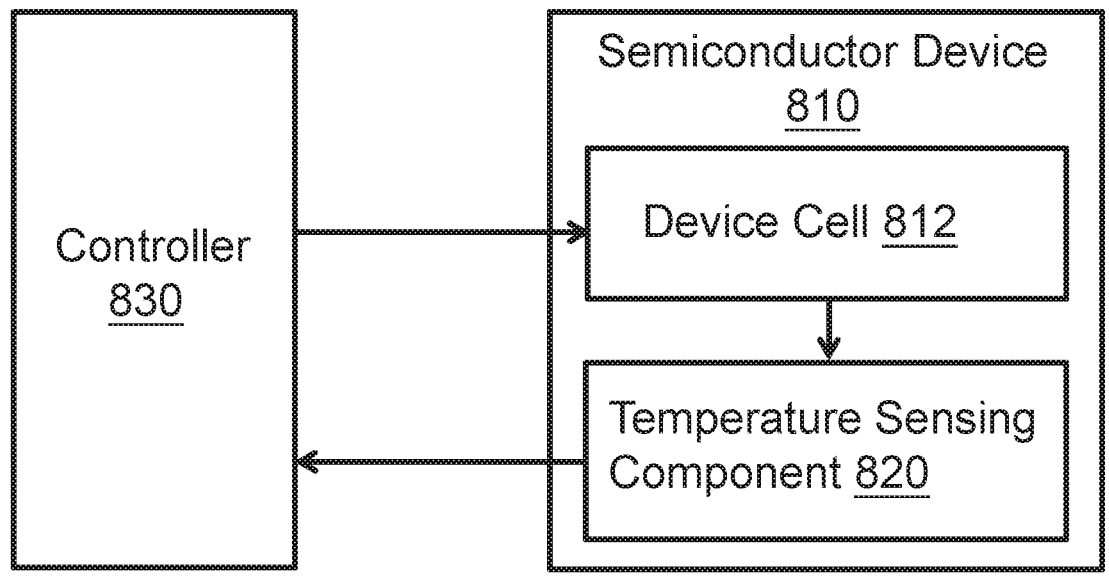
FIG. 8 illustrates a temperature sensing system in accordance with an embodiment.

In accordance with yet a further aspect of embodiments, FIG. 8 illustrates a temperature sensing system in accordance with an embodiment. As illustrated, the temperature sensing system includes a semiconductor device 810 and a controller 830.

The semiconductor device 810 may be, for example, a specific implementation of one or more of the semiconductor devices as illustrated in FIGS. 1A-1C, 2, 3 or variations thereof. The semiconductor device 810 includes a device cell 812 and a temperature sensing component 820 adjacent to the device cell 812. The temperature sensing component 820 may be, for example, a specific implementation of one or more of the temperature sensing components as illustrated in FIGS. 1A-1C, 2, 3 or variations thereof.

The controller 830 may include one or more processors, microprocessors, and/or microcontrollers. The controller 830 may include algorithms or software that are programmed to execute one or more methods or steps or perform one or more functions. The controller 830 may be implemented as electric circuits that are packaged or integrated as one or more modules to achieve one or more algorithms or perform one or more functions. The controller 830 electrically communicates with both the temperature sensing component 820 and the device cell 812. As such, the controller 830 receives temperature information from the temperature sensing component 820, and also imposes gate control signal to the device cell 812 to control the operation states of the semiconductor device 810.

In operation, temperature of the semiconductor device 810, in particular the device cell 812, may be determined by environmental temperature and/or its self-heating. This will change device performance and raise safety concerns, such as in certain extreme temperature. The temperature sensing component 820 monitors the semiconductor device 810 and generates temperature information associated with the semiconductor device 810. The temperature information may be generated in response to temperature changes of the semiconductor device 810. The temperature sensing component 820 then sends the temperature information to the controller 830. The controller 830 processes the received temperature information and takes proper actions accordingly. The actions may include turning on or off semiconductor device 810, raising or lowering the gate voltage, making alarm, etc. For example, if the temperature is high, the controller 830 may lower the gate voltage applied to the device cell 812, thereby suppressing or mitigating heat damage.

Figure 9:
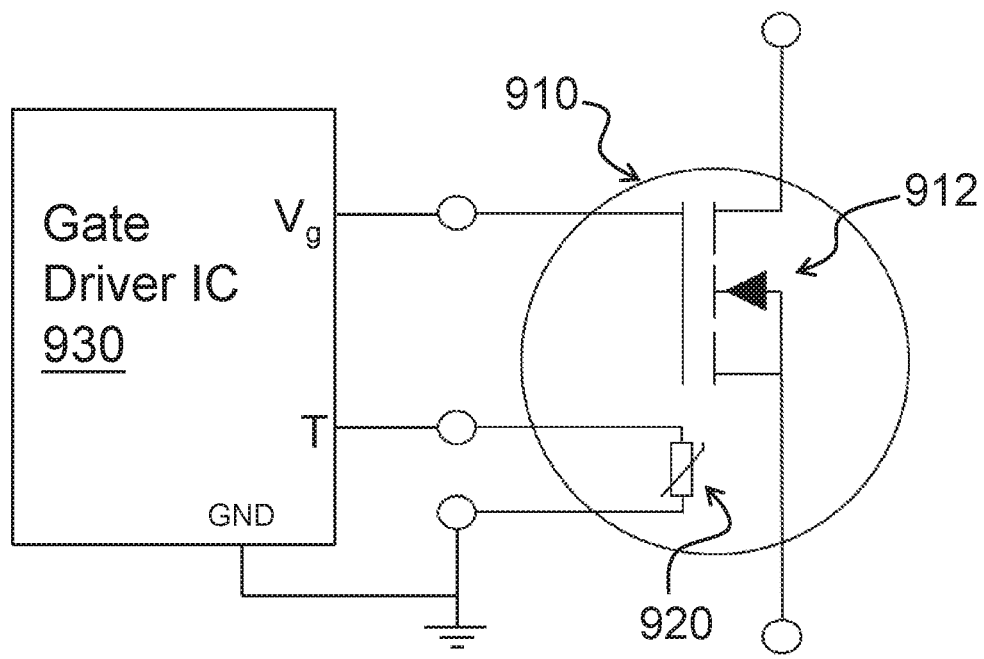
FIG. 9 illustrates a temperature sensing system in accordance with an embodiment.

FIG. 9 illustrates a temperature sensing system in accordance with an embodiment. The temperature sensing system may be, for example, a specific implementation of the system with reference to FIG. 8.

As illustrated, the temperature sensing system includes a semiconductor device 910 and a gate driver integrated circuit (IC) 930. The semiconductor device 910 includes a MOSFET cell 912. A NTC resistor 920 is disposed within the semiconductor device 910 and adjacent to the MOSFET cell 912. The gate component of the MOSFET cell 912 and the NTC resistor 920 are formed of polycrystalline silicon and spaced apart from each other.

The gate driver IC 930 may be, for example, a specific implementation of the controller 830 with reference to FIG. 8. The gate driver IC 930 drives the semiconductor device 910 so that the semiconductor device 910 operates in various operation states. The gate driver IC 930 also receives temperature information from the NTC resistor 920 and responsively adjust the control of the semiconductor device 910.

The NTC resistor 920 is physically close to the MOSFET cell 912 and they feel same or similar temperature. In response to a change in temperature of the MOSFET cell 912, resistance of the NTC resistor 920 changes in an opposite direction and voltage across the NTC resistor 920 changes accordingly. As the gate driver IC 930 electrically connects to the NTC resistor 920, it receives temperature information, such as voltage signals, from the NTC resistor 920 via terminal T. Based on the temperature information, the gate driver IC 930 determines the temperature of the MOSFET cell 912. The gate driver IC 930 then decides whether to adjust the gate control signal for the MOSFET cell 912, and if yes, sends an adjusted gate control signal via a terminal denoted as Vg to the MOSFET cell 912.

Figure 10:
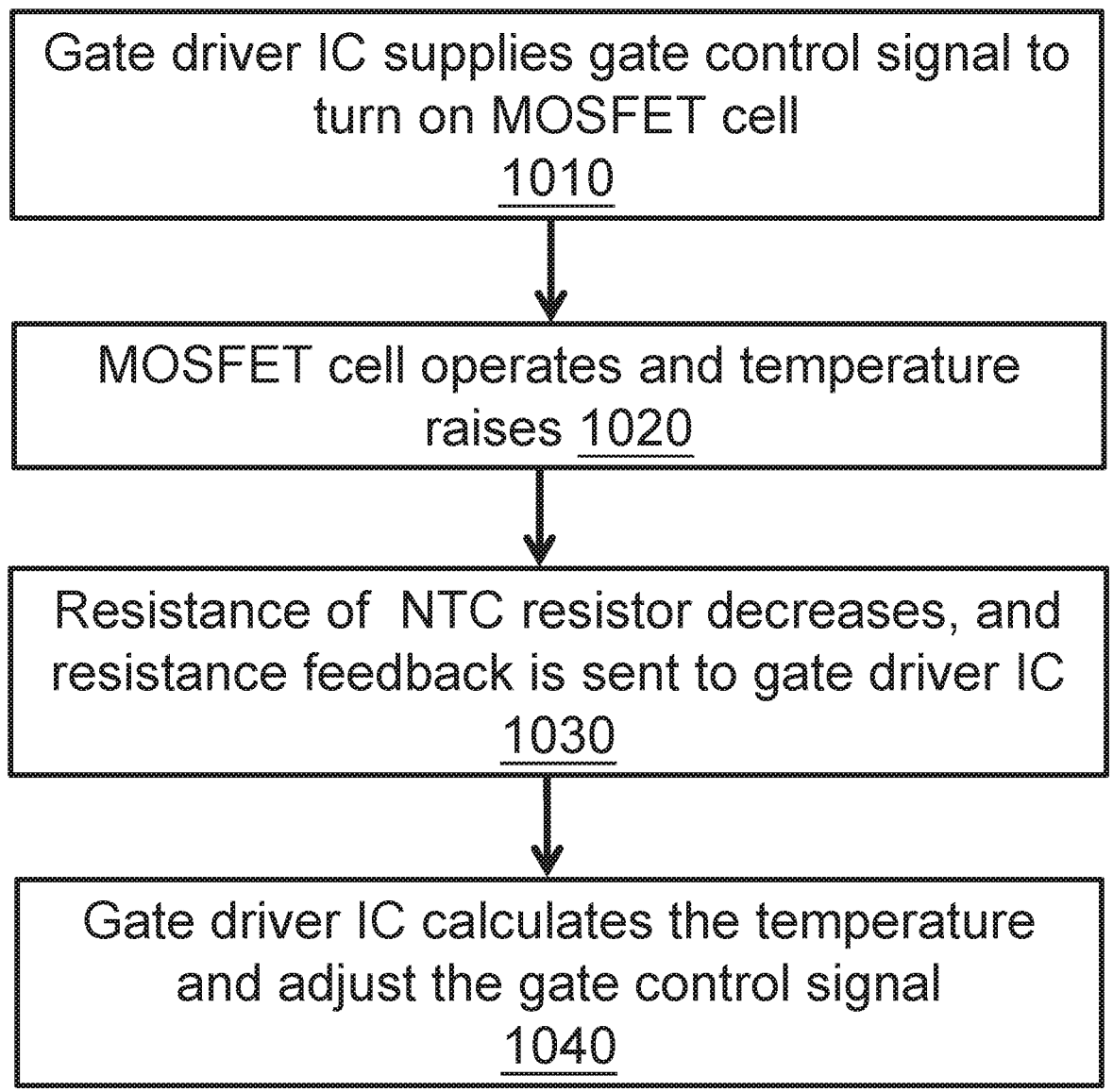
FIG. 10 illustrates a temperature sensing method in accordance with an embodiment.

FIG. 10 illustrates a temperature sensing method in accordance with an embodiment. The method may be, for example, a specific implementation that can be implemented by the system as illustrated in FIG. 9.

At block 1010, a gate driver IC supplies a gate control signal to turn on a MOSFET cell. For example, the gate control signal is larger than the threshold voltage of the MOSFET cell so that the MOSFET cell is switched on. The values of the gate control signal may be adjusted so that the MOSFET cell operates in a different operating state.

At block 1020, as the MOSFET cell operates, temperature raises and adds up to the environment temperature. At block 1030, as a NTC resistor is adjacent to the MOSFET cell, the NTC resistor is subject to a same or similar heat environment. As such, in response to the temperature increase, resistance of the NTC resistor decreases. Accordingly, voltage across the NTC resistor decreases. The voltage signal as a resistance feedback is transmitted to the gate driver IC.

At block 1040, the gate driver IC calculates the temperature and adjust the gate control signal. By way of example, the gate driver IC includes algorithms that map a received voltage value to a temperature value. As such, the gate driver IC calculates the temperature from the received voltage signal. The gate driver IC then compares the calculated temperature with a preset threshold.

In an embodiment, when the temperature is larger than a first threshold (such as 100° C.), the gate driver IC considers the MOSFET cell hot and then lower the gate control signal so that operating current of the MOSFET cell lowers. In another embodiment, when the temperature reaches a second threshold (such as 175° C.), the gate driver IC considers the MOSFET cell too hot and in a danger situation that would permanently damage the cell, the gate driver IC then reduces the gate voltage signal to below zero, and turns off the MOSFET cell, thereby preventing the MOSFET cell from being damaged. In some other embodiments, when the temperature is low, the gate driver IC may increase the gate control signal to increase the operating current of the MOSFET cell.

In the above embodiments, the gate voltage signal adjustment can be incremental with preset intervals. It can also be continuous according to the relationship of calculated temperature and gate control signal.

In the above descriptions, the temperature sensing components with reference to one or more figures are illustrated as NTC resistors. Those skilled in the art would appreciate that in some embodiments, positive temperature coefficient (PTC) resistors may also be possible according to practical needs.

One or more figures as illustrated show a semiconductor device having a device cell. This is illustrative. In some embodiments, a semiconductor device may include two or more device cells. The device cells may include same or different kinds of devices, such as MOSFET, IGBT, JFET, etc. A device cell may include one device, or multiple devices. Further, a semiconductor device may include one temperature sensing component, or may include multiple temperature sensing components.

As used herein, the term "geometric layout" refers to geometric parameters. A geometric layout of a polycrystalline silicon layer, for example, includes, but not limited to, shape, thickness, width, length, ratio of length to width, regularity or irregularity of the polycrystalline silicon layer.

As used herein, the term "sensitivity" refers to the percent change in measurable output for a given change in temperature. For example, the sensitivity may be a percent change in sheet resistance for a unit change in temperature. As another example, the sensitivity may be a percent change in resistance for a unit change in temperature. As a further example, the sensitivity may be a percent change in resistivity for a unit change in temperature. Other measurable output may also be possible.

As used herein, the term "temperature range" refers to a range of temperature that a temperature sensing component is able to detect or sense.

As used herein, the term "temperature information" refers to information associated with or related to temperature such that the temperature can be derived directly or indirectly from this information. The temperature information may be one or more electrical signals (such as temperature signals, voltage signals, current signals, etc.) that carry or encode information related to temperature to such an extent that by processing (such as decoding) the information, the temperature can be obtained.

What is claimed is:

1. A semiconductor device comprising:
   a device cell including a gate component configured to receive a gate control signal;
   a temperature sensing component adjacent to the device cell;
   a metal layer contacting a portion of the temperature sensing component; and
   an interlayer dielectric layer covering at least partially the temperature sensing component and the gate component,
   wherein each of the temperature sensing component and the gate component includes polycrystalline silicon,
   wherein the temperature sensing component is formed as a polycrystalline silicon resistor,
   wherein the temperature sensing component and the gate component are formed from a same polycrystalline silicon layer and spaced from each other;
   wherein the temperature sensing component and the gate component are disposed on a common layer, and both the temperature sensing component and the gate component directly contact the common layer, the common layer being a dielectric layer;
   wherein the polycrystalline silicon of the temperature sensing component is doped with N-type impurities of a first impurity concentration and the polycrystalline silicon of the gate component is doped with N-type impurities of a second impurity concentration, and the first impurity concentration is smaller than the second impurity concentration,
   wherein the portions of the temperature sensing component contacting the metal layer are doped more heavily compared with other portions of the temperature sensing component,
   wherein the temperature sensing component has a negative temperature coefficient, and
   wherein the semiconductor device is selected From a group consisting of a metal-oxide-semiconductor field-effect transistor, an insulated-gate bipolar transistor, and a junction gate field-effect transistor.

2. The semiconductor device of claim 1, wherein the N-type impurities for the temperature sensing component and the gate component are selected from a group consisting of phosphorus, arsenic, and nitrogen.

3. The semiconductor device of claim 1, wherein the temperature sensing component has a shape of a strip.

4. The semiconductor device of claim 1, wherein the temperature sensing component has a shape of configuration including a plurality of strip portions, and neighboring strip portions are connected through a curved potion.

5. The semiconductor device of claim 1 wherein the thickness of the polycrystalline silicon resistor is in a range from 200 nm to 1 um.

6. A temperature sensing system, comprising:
   a semiconductor device including a device cell and a temperature sensing component adjacent to the device cell, the device cell including a gate component configured to receive a gate control signal, each of the temperature sensing component and the gate component including polycrystalline silicon disposed on a common layer, the semiconductor device further including an interlayer dielectric layer that covers at least partially the temperature sensing component and the gate component, and a metal layer contacting a portion of the temperature sensing component; and
   a controller configured to generate the gate control signal and adjust the gate control signal in response to temperature information received from the temperature sensing component, wherein the temperature sensing component is formed as a polycrystalline silicon resistor,
   wherein the temperature sensing component and the gate component are formed from a same polycrystalline silicon layer and spaced from each other,
   wherein both the temperature sensing component and the gate component directly contact the common layer, the common layer being a dielectric layer;
   wherein the polycrystalline silicon of the temperature sensing component is doped with N-type impurities of a first impurity concentration, and the polycrystalline silicon of the gate component is doped with N-type impurities of a second impurity concentration, and the first impurity concentration is smaller than the second impurity concentration, wherein the portions of the temperature sensing component contacting the metal layer are doped more heavily compared with other portions of the temperature sensing component;

wherein the temperature sensing component has a negative temperature coefficient, and wherein the semiconductor device is selected from a group consisting of a metal-oxide-semiconductor field-effect transistor, an insulated-gate bipolar transistor, and a junction gate field-effect transistor.

7. The temperature sensing system of claim 6, wherein the gate control signal is a voltage signal.

8. The temperature sensing system of claim 6, wherein the temperature sensing component is configured to detect a temperature range from −55 degree centigrade to 250 degree centigrade.

\* \* \* \* \*